United States Patent
Tseng et al.

(10) Patent No.: US 9,485,863 B2
(45) Date of Patent: Nov. 1, 2016

(54) CARRIER AND METHOD FOR FABRICATING CORELESS PACKAGING SUBSTRATE

(71) Applicant: Unimicron Technology Corporation, Taoyuan (TW)

(72) Inventors: Tzyy-Jang Tseng, Taoyuan (TW); Chung W. Ho, Taoyuan (TW); Dyi-Chung Hu, Taoyuan (TW); Huan-Ling Lee, Taoyuan (TW); Sheng-Yuah He, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 160 days.

(21) Appl. No.: 13/780,421

(22) Filed: Feb. 28, 2013

(65) Prior Publication Data

US 2013/0335928 A1    Dec. 19, 2013

(30) Foreign Application Priority Data

Jun. 18, 2012   (TW) .............. 101121815 A

(51) Int. Cl.
  *H05K 1/05* (2006.01)
  *H05K 3/46* (2006.01)
  *H05K 3/10* (2006.01)
  *H05K 1/02* (2006.01)
  *H01L 21/56* (2006.01)
  *H01L 23/14* (2006.01)
  *H01L 23/498* (2006.01)

(52) U.S. Cl.
  CPC .............. *H05K 1/05* (2013.01); *H01L 21/568* (2013.01); *H05K 1/02* (2013.01); *H05K 3/10* (2013.01); *H05K 3/4644* (2013.01); *H05K 3/4682* (2013.01); *H01L 23/145* (2013.01); *H01L 23/49811* (2013.01); *H01L 23/49827* (2013.01); *H01L 2924/0002* (2013.01); *H05K 1/0271* (2013.01); *Y10T 29/49155* (2015.01)

(58) Field of Classification Search
  CPC ........ H05K 3/4644; H05K 1/05; H05K 3/10; H05K 3/4682
  See application file for complete search history.

(56) References Cited

U.S. PATENT DOCUMENTS

| | | | |
|---|---|---|---|
| 5,231,751 A * | 8/1993 | Sachdev et al. | ................ 29/852 |
| 2010/0096078 A1 | 4/2010 | Nakamura et al. | |
| 2010/0096177 A1* | 4/2010 | Lee et al. | ...................... 174/264 |
| 2011/0111220 A1* | 5/2011 | Takarada et al. | ............. 428/345 |
| 2012/0228015 A1* | 9/2012 | Ho | ................................ 174/260 |

FOREIGN PATENT DOCUMENTS

| | | |
|---|---|---|
| CN | 101409238 A | 4/2009 |
| JP | 2007-173658 A | 7/2007 |
| JP | 2010-199616 A | 9/2010 |
| TW | 200943508 | 10/2009 |
| TW | 200943508 A | 10/2009 |
| TW | 201131669 | 9/2011 |

* cited by examiner

*Primary Examiner* — Jeremy C Norris
(74) *Attorney, Agent, or Firm* — Jianq Chyun IP Office

(57) ABSTRACT

A fabrication method of a coreless packaging substrate is provided, including the steps of: forming an inner built-up circuit board on a carrier; removing the carrier; and symmetrically forming a first outer built-up structure and a second outer built-up structure on top and bottom surfaces of the inner built-up circuit board, respectively. The present invention effectively increases the product yield, saves the fabrication cost, and reduces wastes.

12 Claims, 5 Drawing Sheets

FIG.2A"

CARRIER AND METHOD FOR FABRICATING CORELESS PACKAGING SUBSTRATE

CROSS-REFERENCES TO RELATED APPLICATIONS

This application claims under 35 U.S.C. §119(a) the benefit of Taiwanese Application No. 101121815, filed Jun. 18, 2012, the entire contents of which is incorporated herein by reference.

BACKGROUND OF THE INVENTION

1. Field of the Invention

The present invention relates to carriers and fabrication methods of coreless packaging substrates, and, more particularly, to a carrier and a method for fabricating a coreless packaging substrate using the same.

2. Description of Related Art

Along with the rapid development of electronic industries, electronic products are developed towards multi-function and high performance. Accordingly, different types of packages, such as wire bonding or flip-chip packages, have been developed. To meet high integration and miniaturization requirements of semiconductor packages, packaging substrates are developed from single layer circuit boards to multi-layer circuit boards so as to provide more spaces for circuit layout in a limited area by using interlayer connection technologies and reduce the thickness of the packaging substrates.

A conventional packaging substrate has a core board having circuits formed thereon, and built-up structures symmetrically formed on both sides of the core board. However, the use of the core board increases the length of the conductive path and the thickness of the overall structure, and consequently does not meet high performance and miniaturization requirements of electronic products.

Accordingly, coreless packaging substrates are provided to shorten the conductive path and reduce the thickness of the overall structure.

FIGS. 1A to 1G are schematic cross-sectional views showing a conventional coreless packaging substrate and a fabrication method thereof.

Referring to FIG. 1A, a release layer 11 is formed on each of top and bottom surfaces of a carrier 10. The release layer 11 has an area smaller than that of the carrier 10. Therefore, an adhesive layer 12 is formed on a portion of the carrier 10 that is not covered by the release layer 11 such that the release layer 11 is surrounded by the adhesive layer 12. Further, a metal layer 13 is formed on the release layer 11 and the adhesive layer 12.

In another embodiment, referring to FIG. 1A', an adhesive layer 12 is formed on each of top and bottom surfaces of a carrier 10. Further, a release layer 11 having an area smaller than that of the carrier 10 is attached to the adhesive layer 12 in a manner that the release layer 11 is surrounded by the adhesive layer 12. Thereafter, a metal layer 13 is formed on the release layer 11 and the adhesive layer 12.

Referring to FIG. 1B, continued from FIG. 1A, a base circuit layer 14 is formed on the metal layer 13 at the top side of the carrier 10, and a built-up structure 15 is formed on the metal layer 13 and electrically connected to the base circuit layer 14. The base circuit layer 14 has a plurality of first conductive pads 141. The surface of the built-up structure 15 has a plurality of second conductive pads 151.

Referring to FIG. 1C, the carrier 10 is cut along cutting edges 16 that pass through the release layers 11 such that the adhesive layers 12 around the release layers 11 are removed.

Referring to FIG. 1D, a delamination process is performed along an interface between the metal layer 13 and the release layer 11 at the top side of the carrier 10 so as to remove the carrier 10, the release layers 11 at the top and bottom sides of the carrier 10, and the metal layer 13 at the bottom side of the carrier 10.

Referring to FIG. 1E, the remaining metal layer 13 is removed.

Referring to FIG. 1F, an insulating protective layer 17 is formed on a bottom surface of the built-up structure 15 and the base circuit layer 14, and a plurality of openings 170 are formed in the insulating protective layer 17 for exposing the first conductive pads 141.

Referring to FIG. 1G, a plurality of solder balls 18a and a plurality of solder bumps 18b are formed on the first conductive pads 141 and the second conductive pads 151, respectively, thus obtaining a coreless packaging substrate.

However, since the cutting process is performed to the carrier after the built-up structure has been formed on the carrier, great stresses accumulated in the packaging substrate can easily cause warpage of the packaging substrate, thus adversely affecting the product yield. Further, the carrier cannot be repeatedly used in the same fabrication process due to the cutting process.

Therefore, how to overcome the above-described drawbacks has become critical.

SUMMARY OF THE INVENTION

In view of the above-described drawbacks, the present invention provides a fabrication method of a coreless packaging substrate, which comprises the steps of: forming an inner built-up circuit board on a carrier; removing the carrier; and symmetrically forming a first outer built-up structure and a second outer built-up structure on top and bottom surfaces of the inner built-up circuit board, respectively.

The present invention further provides a carrier, which comprises: a carrying board; a pressure sensitive adhesive layer formed on at least one surface of the carrying board; and a metal layer formed on the pressure sensitive adhesive layer.

The present invention provides another carrier, which comprises: a metal board; and a metal layer formed on at least one surface of the metal board, wherein the bonding force between the metal layer and the metal board in a central region is much less than that in a peripheral region.

According to the present invention, only a portion of built-up structure, i.e., an inner built-up circuit board, is formed on a carrier, thus preventing accumulation of too great the stresses. Further, by symmetrically forming built-up structures on two sides of the inner built-up circuit board after removing the carrier, stresses generated by the symmetric built-up structures can offset each other. As such, only a small stress is applied on the packaging substrate, thereby preventing warpage of the packaging substrate and increasing the product yield. Furthermore, the carrier of the present invention can be repeatedly used to save the fabrication cost and reduce wastes.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "top", "bottom", "on" etc. are only used as a matter of descriptive convenience and not intended to have any other significance or provide limitations for the present invention.

Figure 1A:
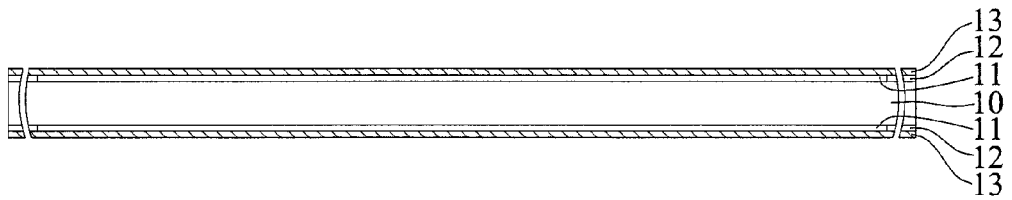
FIGS. 1A to 1G are schematic cross-sectional views showing a conventional coreless packaging substrate and a fabrication method thereof, wherein FIG. 1A' shows another embodiment of FIG. 1A.
Figure 1A:
Figure 1B:
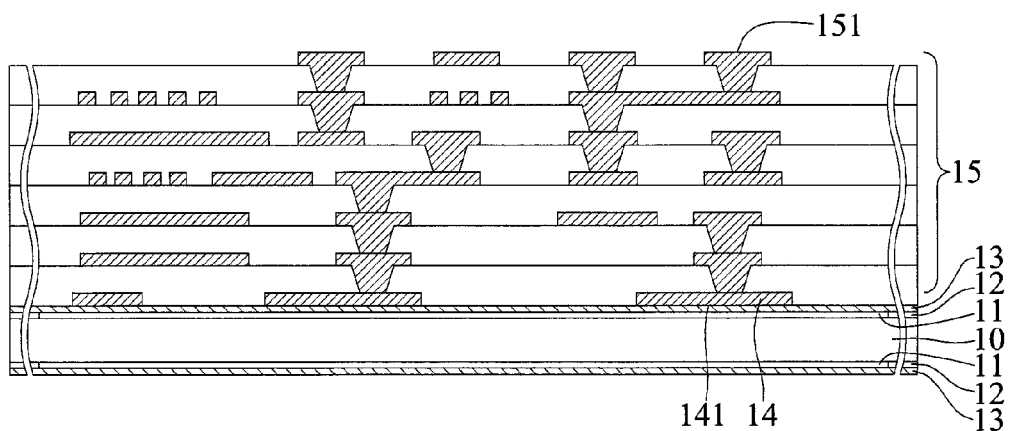
Figure 1C:
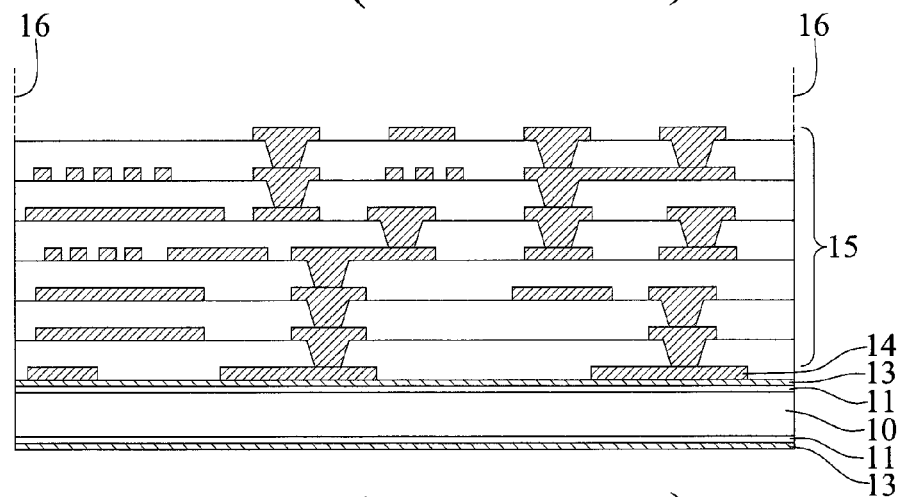
Figure 1D:
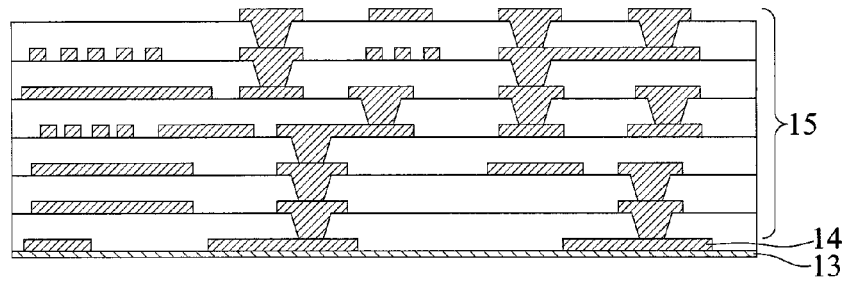
Figure 1E:
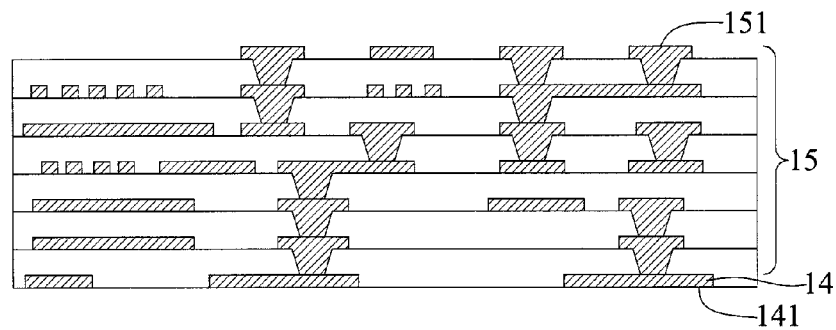
Figure 1F:
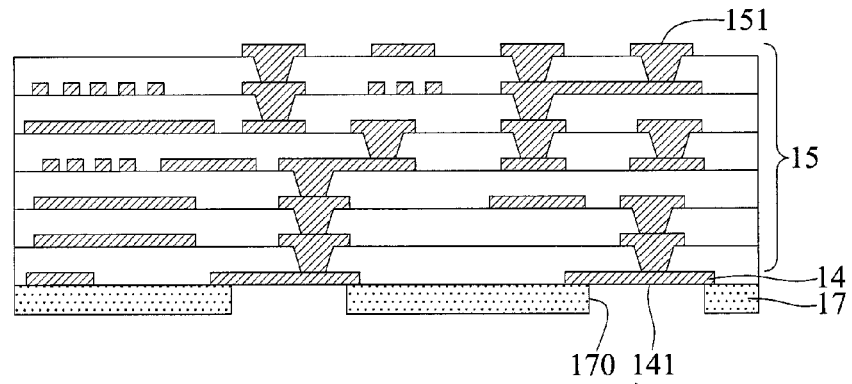
Figure 1G:
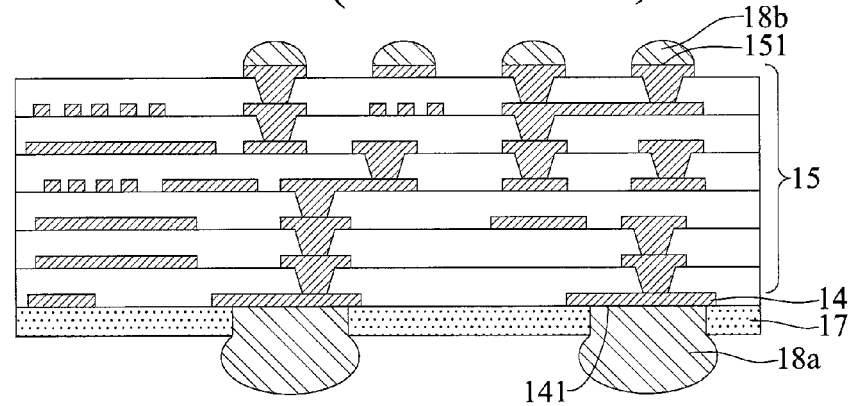
Figure 2A:
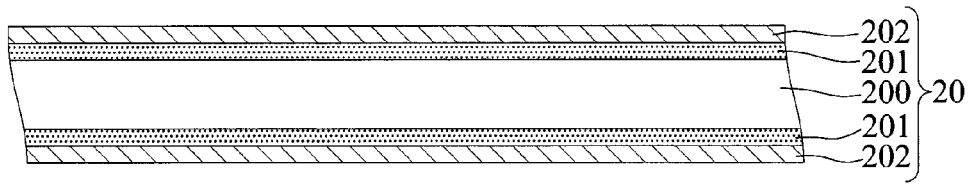
FIGS. 2A to 2H are schematic cross-sectional views showing a carrier and a fabrication method of a coreless packaging substrate according to the present invention, wherein FIGS. 2A' and 2A" show other embodiments of FIG. 2A.
Figure 2A:
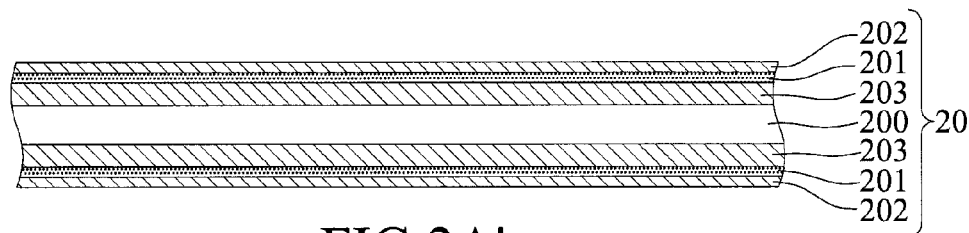

FIGS. 2A to 2H are schematic cross-sectional views showing a carrier and a method for fabricating a coreless packaging substrate according to the present invention, wherein FIGS. 2A' and 2A" show other embodiments of FIG. 2A.

Referring to FIG. 2A, a carrier 20 is provided. The carrier 20 has a carrying board 200, a release layer 201 formed on each of two opposite surfaces of the carrying board 200, and a first metal layer 202 formed on the release layer 201. The carrying board 200 can be made of an organic polymer material such as bismaleimide triazine (BT). Alternatively, the carrying board 200 can be a copper clad laminate (CCL) with a dielectric material such as prepreg formed on two opposite surfaces thereof. In other embodiments, the carrying board 200 can be made of aluminum, copper or stainless steel. The release layer 201 can be a pressure sensitive adhesive (PSA) layer made of siloxane, silicone or acrylic, for example. The first metal layer 202 can be made of copper and have a thickness ranging from 1 um to 36 um. Further, the bonding force between the release layer 201 and the carrying board 200 is greater than the bonding force between the release layer 201 and the first metal layer 202. The release layer 201 is only temporarily bonded to the first metal layer 202 so as to facilitate subsequent separation of the release layer 201 from the first metal layer 202 by an external force.

Alternatively, referring to FIG. 2A', the carrier 20 has a carrying board 200, a second metal layer 203 formed on each of two opposite surfaces of the carrying board 200, a release layer 201 formed on the second metal layer 203, and a first metal layer 202 formed on the release layer 201. The carrying board 200 can be made of an organic polymer material such as bismaleimide triazine (BT). Alternatively, the carrying board 200 can be a copper clad laminate (CCL) with a dielectric material such as prepreg formed on two opposite surfaces thereof. The second metal layer 203 can be made of copper and have a thickness ranging from 5 um to 40 um. The release layer 201 can be made of an organic material, such as a release film, a metal material such as nickel, or an inorganic material such as nickel oxide. In other embodiments, a copper foil bonded with a release layer as provided by companies such as Mitsui, Nippon-Denk, Furukawa or Olin can be used. The first metal layer 202 can be made of copper and have a thickness ranging from 1 um to 10 um.

Alternatively, referring to FIG. 2A", the carrier 20 has a metal board 200" and a first metal layer 202 formed on each of two opposite surfaces of the metal board 200" by electroplating. The metal board 200" can be made of stainless steel, for example, and have a thickness ranging from 0.2 mm to 0.3 mm. Since process equipment in the current packaging substrate industry can carry a maximum load of 2 kg, the metal board 200" preferably has a weight between 0.1 kg and 1.5 kg. Preferably, the surfaces of the metal board 200" are roughened. The first metal layer 202 has a thickness ranging from 1 um to 50 um. The first metal layer 202 can be made of copper. Further, the bonding force between the first metal layer 202 and the metal board 200" in a central region A is much less than that in a peripheral region B. Therefore, when a portion of the first metal layer 202 in the peripheral region B is removed by, for example, grinding, the bonding force between the remaining first metal layer 202 and the metal board 200" is reduced. Consequently, the metal board 200" can be easily removed while its integrity is retained. Therefore, the metal board 200" can be repeatedly used so as to save the fabrication cost and reduce wastes.

In the above-described embodiment, the release layer 201, the first metal layer 202 and the second metal layer 203 are symmetrically formed on two opposite sides of the carrier 20. But it should be noted that the present invention is not limited thereto. For example, the release layer 201, the first metal layer 202 and the second metal layer 203 can be formed on only one side of the carrier 20.

Figure 2B:
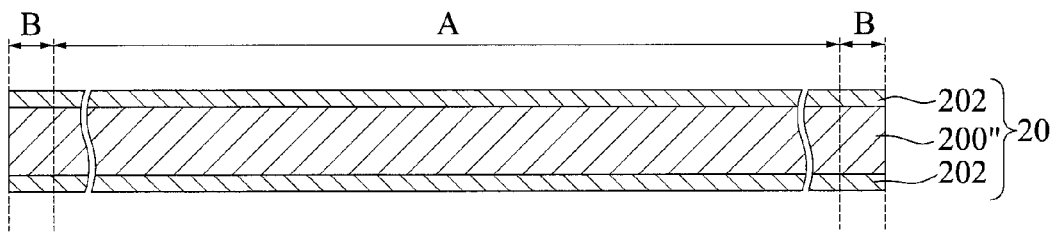
Figure 2B:
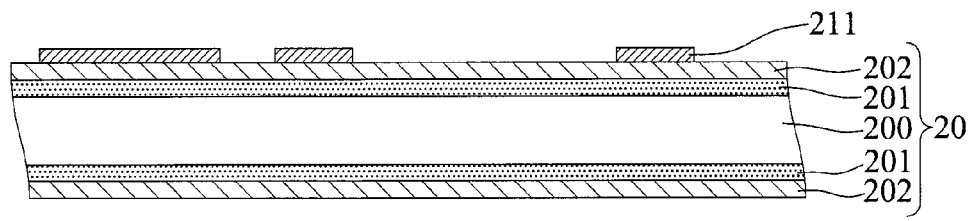

Referring to FIG. 2B, a base circuit layer 211 is formed on one of the two opposite surfaces of the carrier 20.

Figure 2C:
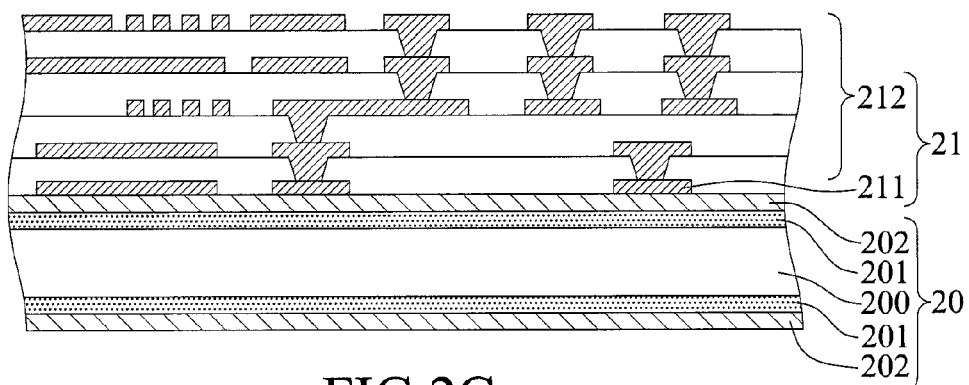

Referring to FIG. 2C, a built-up structure 212 is formed on the carrier 20 so as to be electrically connected to the base circuit layer 211. The base circuit layer 211 and the built-up structure 211 form an inner built-up circuit board 21. The inner built-up circuit board 21 can have a single layer or multiple layers. In another embodiment, the inner built-up circuit board 21 can be symmetrically formed on the two opposite surfaces of the carrier 20. Since it will be well understood by those skilled in the art after reading the disclosure, further description is omitted herein.

Figure 2D:
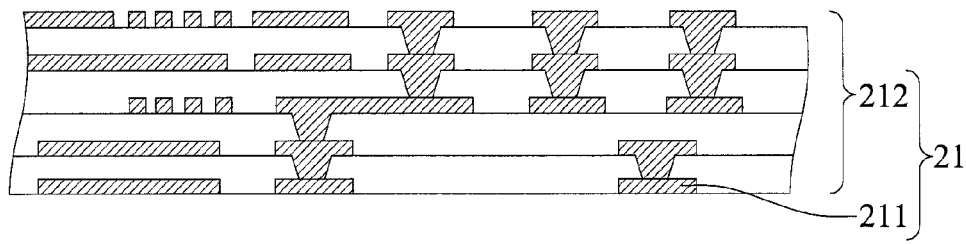

Referring to FIG. 2D, the carrier 20 is removed. Further, the first metal layer 202 on the release layer 201 can be removed. But the release layer 201 retains its adhesive property so as to allow another first metal layer to be formed thereon later. As such, the carrier 20 can be repeatedly used so as to reduce the fabrication cost and reduce wastes.

Figure 2E:
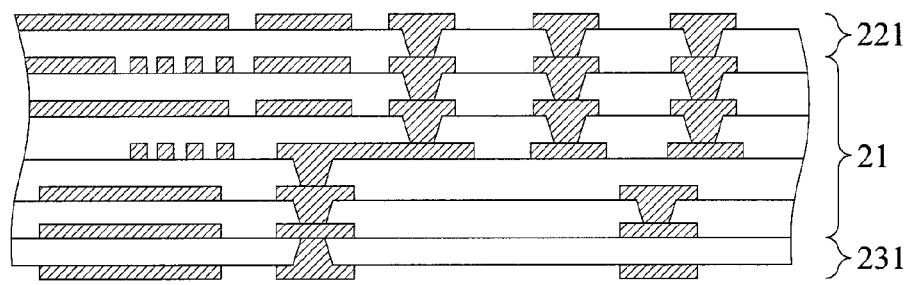
Figure 2F:
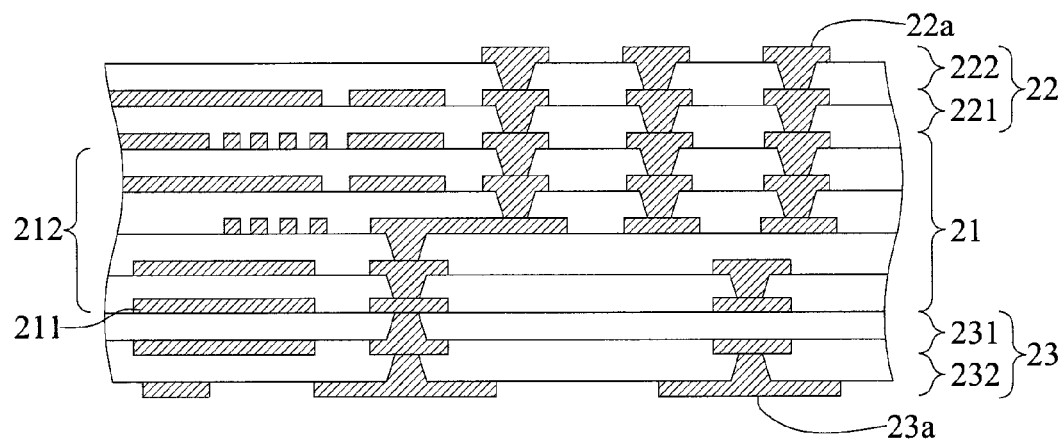

Referring to FIGS. 2E and 2F, a first outer built-up structure 22 and a second outer built-up structure 23 are symmetrically formed on top and bottom surfaces of the inner built-up circuit board 21, respectively. The first outer built-up structure 22 has a first sub-structure 221 and a second sub-structure 222. The second outer built-up structure 23 has a third sub-structure 231 and a fourth sub-structure 232. The surface of the first outer built-up structure 22 has a plurality of first conductive pads 22a, and the surface of the second outer built-up structure 23 has a plurality of second conductive pads 23a. The first outer built-up structure 22 and the second outer built-up structure 23 can have multiple layers, as shown in the drawings, or only have a single layer.

Figure 2G:
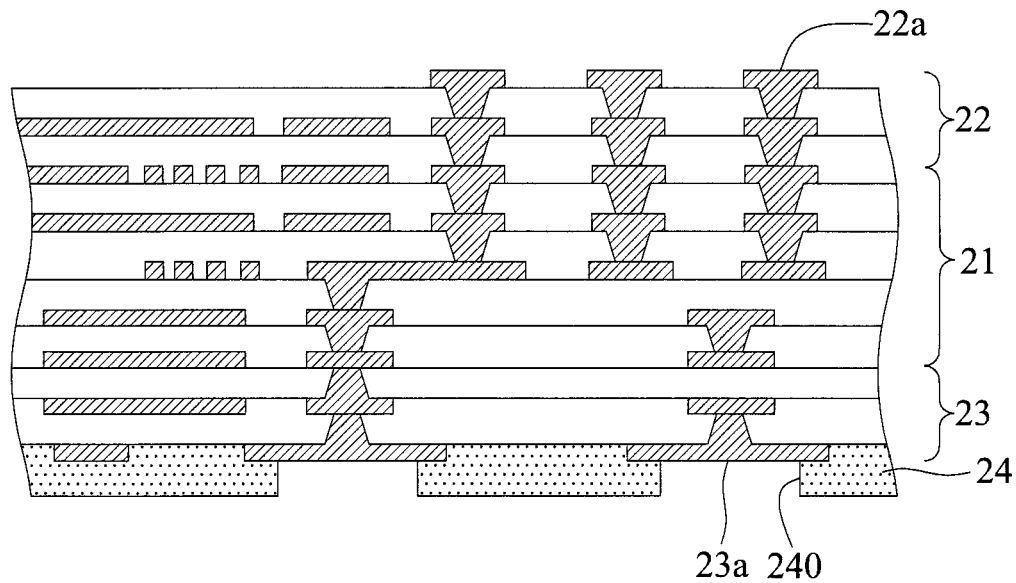

Referring to FIG. 2G, an insulating protective layer 24 is formed on the surface of the second outer built-up structure 23, and a plurality of openings 240 are formed in the insulating protective layer 24 for exposing the second conductive pads 23a.

Figure 2H:
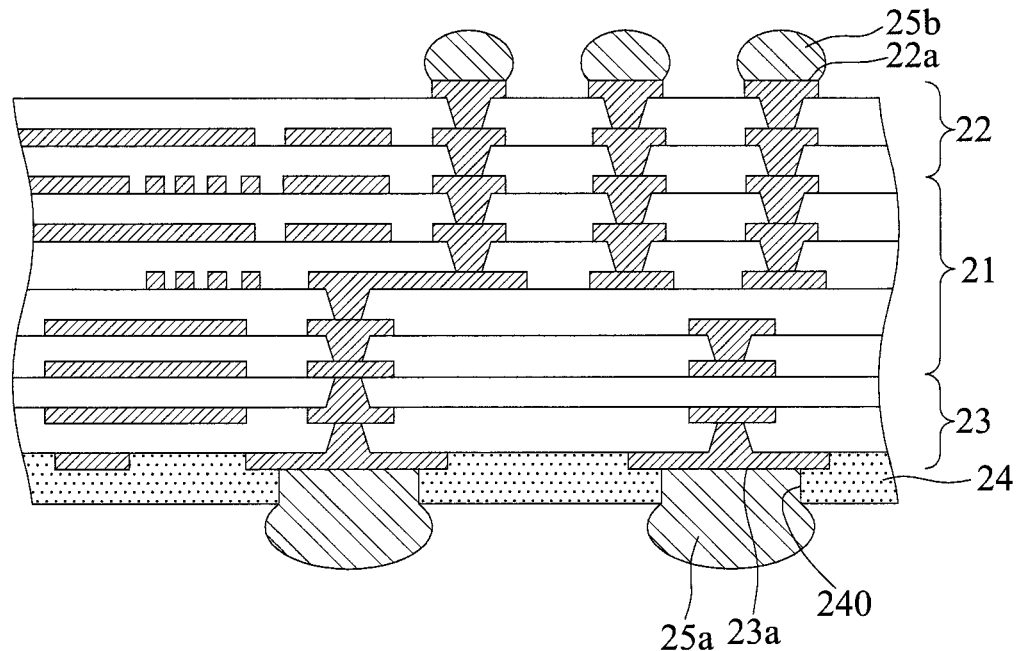

Referring to FIG. 2H, a plurality of solder bumps 25b and a plurality of solder balls 25a are formed on the first conductive pads 22a and the second conductive pads 23a, respectively.

The present invention further provides a carrier 20, which has a carrying board 200, a release layer 201 being a pressure sensitive adhesive layer and formed on at least one surface of the carrying board 200, and a first metal layer 202 formed on the release layer 201.

The present invention provides another carrier 20, which has a metal board 200" made of stainless steel, for example, and a first metal layer 202 formed on at least one surface of the metal board 200", wherein the bonding force between the first metal layer 202 and the metal board 200" in a central region A is much less than that in a peripheral region B. The first metal layer 202 can be made of electroplated copper.

Although the fabrication method of a coreless packaging substrate of the present invention can be achieved by using the carriers of the present invention, the present invention is not limited thereto. For example, other carriers can be used for forming built-up circuit boards thereon and then the carriers are removed such that first and second outer built-up structures can be symmetrically formed on the inner built-up circuit boards. Further, the carrier of the present invention can be used in other methods for fabricating coreless packaging substrates or used for fabricating a packaging substrate having an embedded electronic component such as a semiconductor chip.

According to the present invention, only a portion of built-up structure, i.e., an inner built-up circuit board, is formed on a carrier, thus preventing accumulation of too great the stresses. Further, by symmetrically forming built-up structures on two sides of the inner built-up circuit board after removing the carrier, stresses generated by the symmetric built-up structures can offset each other. As such, only a small stress is applied on the packaging substrate, thereby preventing warpage of the packaging substrate and increasing the product yield. Furthermore, the carrier of the present invention can be repeatedly used to save the fabrication cost and reduce wastes.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A carrier, comprising:
   a metal board; and
   a metal layer formed on at least one surface of the metal board, wherein a bonding force between the metal layer and the metal board in a central region is less than that in a peripheral region.

2. The carrier of claim 1, wherein the metal board is made of stainless steel.

3. The carrier of claim 1, wherein the metal layer is made of electroplated copper.

4. A fabrication method of a coreless packaging substrate, comprising the steps of:
   providing a carrier, wherein the carrier comprises a carrying board, a release layer being a pressure sensitive adhesive layer formed on at least one surface of the carrying board, and a first metal layer formed on the release layer;
   forming a base circuit layer on the first metal layer, wherein the base circuit layer is in direct contact with the first metal layer;
   forming on the first metal layer a built-up structure electrically connected to the base circuit layer, so as for the base circuit layer and the built-up structure to form an inner built-up circuit board;
   removing the carrier; and
   symmetrically forming a first outer built-up structure and a second outer built-up structure on top and bottom surfaces of the inner built-up circuit board, respectively.

5. The fabrication method of claim 4, wherein a surface of the first outer built-up structure has a plurality of first conductive pads.

6. The fabrication method of claim 4, wherein a surface of the second outer built-up structure has a plurality of second conductive pads.

7. The fabrication method of claim 4, wherein the first metal layer is made of copper.

8. The fabrication method of claim 4, further comprising, after removing the carrier, removing the first metal layer on the pressure sensitive adhesive layer, such that the pressure sensitive adhesive layer retains its adhesive property so as to allow another metal layer to be formed thereon later.

9. The fabrication method of claim 4, wherein the carrier further comprises a second metal layer formed between the carrying board and the release layer.

10. The fabrication method of claim 9, wherein the second metal layer is made of copper.

11. A fabrication method of a coreless packaging substrate, comprising the steps of:
   providing a carrier, wherein the carrier comprises a metal board and a metal layer formed on at least one surface of the metal board, and a bonding force between the metal layer and the metal board in a central region is less than that in a peripheral region;
   forming a base circuit layer on the metal layer;
   forming on the metal layer a built-up structure electrically connected to the base circuit layer, so as for the base circuit layer and the built-up structure to form an inner built-up circuit board;
   removing the carrier; and
   symmetrically forming a first outer built-up structure and a second outer built-up structure on top and bottom surfaces of the inner built-up circuit board, respectively.

12. The fabrication method of claim 11, wherein removing the carrier further comprises removing the metal layer in the peripheral region so as to reduce the bonding force between the metal layer and the metal board while keeping the integrity of the metal board.

* * * * *